United States Patent [19]

Biggerstaff et al.

[11] Patent Number: 5,169,408

[45] Date of Patent: Dec. 8, 1992

[54] APPARATUS FOR WAFER PROCESSING WITH INSITU RINSE

[75] Inventors: Rex L. Biggerstaff; Charles W. Skinner, both of Lubbock, Tex.; Daniel J. Syverson, Robbinsdale, Minn.; Mark L. Jenson, Princeton, Minn.; James G. Kegley, St. Paul, Minn.

[73] Assignee: FSI International, Inc., Chaska, Minn.

[21] Appl. No.: 470,871

[22] Filed: Jan. 26, 1990

[51] Int. Cl.$^5$ .......................... B08B 3/02; B08B 5/00; B21F 41/00

[52] U.S. Cl. .................. 29/25.01; 156/646; 134/144; 134/149; 134/151; 134/154; 134/155; 134/157; 134/177; 134/182; 134/902

[58] Field of Search ............... 134/114, 144, 149, 151, 134/154, 155, 157, 177, 182, 902; 29/25.01; 156/345, 646

[56] References Cited

U.S. PATENT DOCUMENTS

| | | | |
|---|---|---|---|
| 3,727,620 | 4/1973 | Orr | 134/95 |
| 3,769,992 | 11/1973 | Wallestad | 134/144 |
| 3,990,462 | 11/1976 | Elftmann | 134/102 |
| 4,197,000 | 4/1980 | Blackwood | 354/323 |
| 4,230,515 | 10/1980 | Zajac | 156/345 |
| 4,544,446 | 10/1985 | Cady | 156/639 |
| 4,590,042 | 5/1986 | Drage | 422/186 |
| 4,682,614 | 7/1987 | Silvernail | 134/99 |
| 4,682,615 | 7/1987 | Burkman | 134/102 |
| 4,691,722 | 9/1987 | Silvernail | 134/155 |
| 4,750,505 | 6/1988 | Inuta et al | 134/902 |
| 4,792,378 | 12/1988 | Rose | 156/643 |
| 4,801,335 | 1/1989 | Burkman | 134/25.4 |
| 4,838,979 | 6/1989 | Nishisa et al. | 134/902 |
| 4,857,142 | 8/1989 | Syverson | 156/656 |

OTHER PUBLICATIONS

Then, W., "Apparatus For Cleaning & Drying Wafers", *IBM Technical Disc. Bulletin,* vol. 25, No. 6, Nov. 1982, pp. 2735.

Skidmore, K., "Cleaning Techniques For Wafer Surfaces", *Semiconductor International,* Aug. 1987 pp. 80-85.

*Primary Examiner*—Olik Chaudhuri
*Assistant Examiner*—G. Fourson
*Attorney, Agent, or Firm*—Palmatier & Sjoquist

[57] ABSTRACT

A wafer processing apparatus including a head defining an etching chamber, the sidewall of the head being slidable along the base so that the sidewall and base will normally define an etch chamber; and the sidewall may be moved upwardly to open a discharge passage for rinsing water, and a deflecting surface for deflecting the rinsing water downwardly and draining the rinsing water from the passage. The housing is separable above the deflector ring to provide access to the wafer for inserting the wafer and replacing it.

14 Claims, 3 Drawing Sheets

APPARATUS FOR WAFER PROCESSING WITH INSITU RINSE

This invention relates to the rinsing of silicon wafers after completion of etching steps in the processing of such wafers.

BACKGROUND OF THE INVENTION

In the processing of silicon wafers for the production of integrated circuit chips, numerous steps are involved, some of which involve etching of the oxide films from the wafers. Etching may be accomplished in various ways, but in many instances it is desirable to utilize gas phase etchants which may include hydrogen fluoride gas or other hydrogen halide gases, in many cases diluted with an inert gas such as nitrogen. The etchant gas may include water vapor necessary to start the etching process.

When the actual etching is completed to the degree desired, it is necessary to rinse the etched surface with deionized water for the removal of any by-products of the rinsing process, i.e., any residiual contamination of phosphorous or particulate.

A standard wet or immersion process of rinsing has several disadvantages. For instance, such prior rinsing processes have the disadvantage of uncontrolled particle levels remaining after the rinse, contamination of the surface by electroplation, or by organic contamination. Of course, rinsing by immersion requires additional space in the production areas which is always a matter of importance in manufacturing operations.

SUMMARY OF THE INVENTION

An object of the present invention is to provide for rinsing of a wafer after the completion of etching in a manner to minimize the existence of contamination remaining on the etched surface of the wafer.

A feature of the invention is the performing of the etching and rinsing steps in a single chamber and without handling or moving the wafer between the etch and rinse steps. The chamber requires the gas phase etchant to pass through a membrane to be uniformly applied to the wafer and when the etching is completed, the chamber-defining housing is moved with respect to the wafer to accommodate application of deionized rinse water onto the wafer and simultaneous disposal of the spent rinse water. The wafer remains on its spinning chuck through the rinse.

Subsequently the sequential etch and rinse cycle may be repeated to remove any small amounts of native oxide that may have regrown on the exposed polysilicon surface.

The integrated etch-rinse process, or insitu rinse capability, provides numerous advantages. This rinse process does not add particles to hydrophobic or oxide free wafers. Thick oxide films are removed, ending with very low particle levels; and thin or native oxide layers are removed without adding particles to the remaining surface. The rinse provides removal of device-destroying mobile ion contamination such as sodium, calcium and potassium. Also, the rinse provides for the removal from the wafer surface of electrical lifetime killing metals such as copper, iron, nickel and aluminum. The combination of this rinse is desirable with the use of gas phase etchant which is free of the electroplating properties of aqueous etchant solutions. It is important that the method allows for the application of a final oxide removal process after the rinse, thus providing an ultimate oxide free surface on the wafer.

Of course, integration of the gas phase etching and rinsing without handling the wafer between the etching and rinsing, will save overall process time for the wafer by eliminating transfer time to other operations. Such integration also saves on clean room space for wafer processing due to reduced equipment requirements.

DETAILED SPECIFICATION

Figure 1:
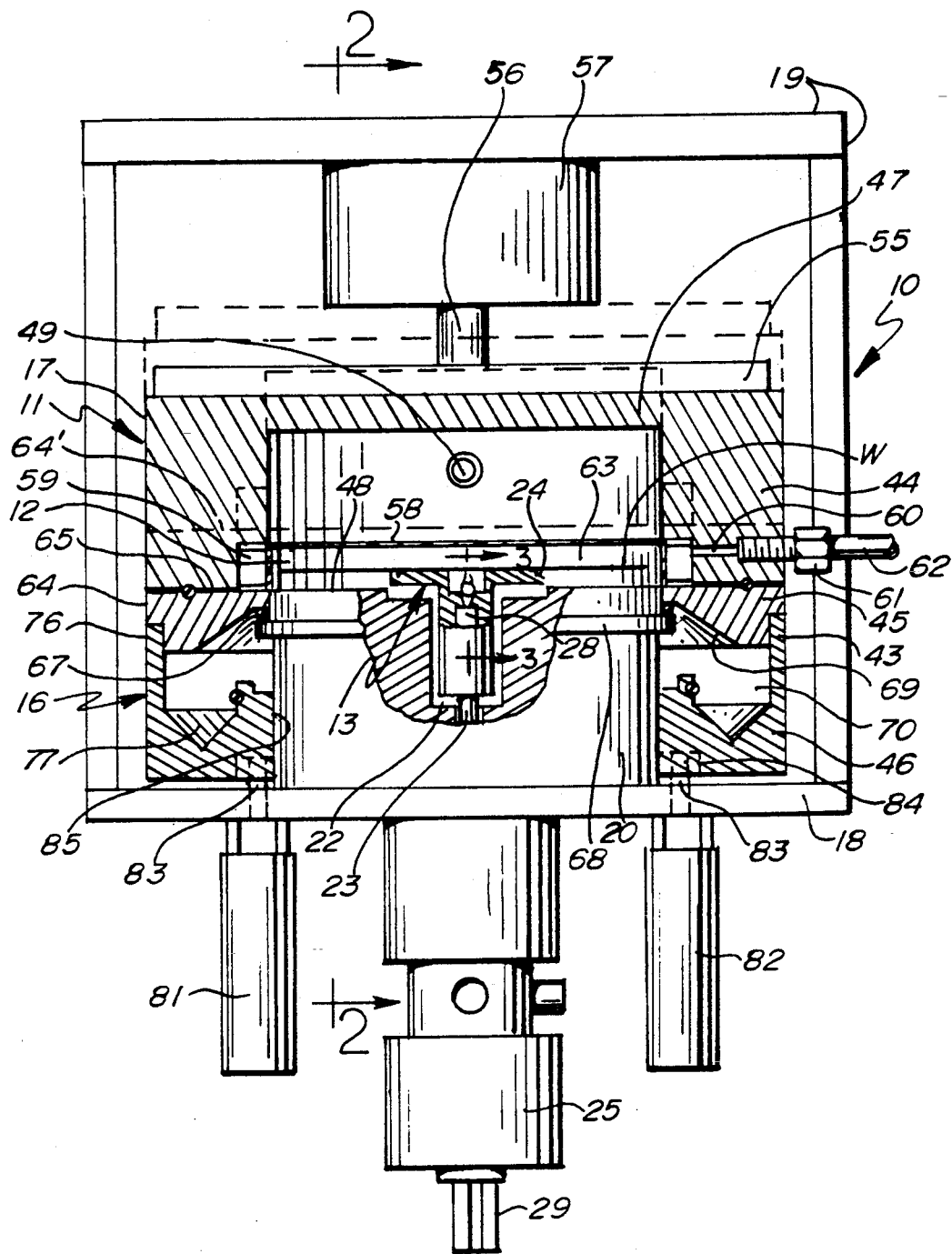
FIG. 1 is a section view through the processing apparatus taken substantially at 1—1 of FIG. 2 and having portions broken away for clarity of detail.

One form of the invention is illustrated in the drawings and is described herein.

The processing apparatus is indicated in general by numeral 10 and includes a head means 11 defining an etching chamber 12, a support means 13 to carry a wafer W being processed; a means 14 for flowing etchant gases into and through the etching chamber; a source 15 of rinsing liquid to be controllably flowed into the etching chamber 12 and across portions of the wafer W after the etching is completed; and also a means 16 for collecting the rinsing liquid which has been flowed over the wafer to carry away any contaminants that may be present.

More specifically, the head means 10 is defined by a housing 17 carried on a support plate 18 on which a superstructure or frame 19 in also affixed. The housing 17 includes a base 20 affixed to the baseplate 18 which has a substantially cylindrical periphery or cylindrical outer wall surface 21. The base 20 has a central opening 22 which receives a drive shaft which is a portion of the support means for the wafer W. The drive shaft has a wafer support or vacuum chuck 24 affixed on its upper end and in the lower portion of the etch chamber 12. The shaft 23 is supported in and driven by a variable speed motor 25 so that the wafer W may be rotated at a wide variety of speeds during the processing of the wafer. For instance, the wafer will be rotated at a low speed of approximately 20 rpm during etching of the wafer; will be rotated at a speed of approximately 500 to 1,500 rpm after the etching is completed and during the rinsing of the wafer; and finally the wafer will be rotated at speeds in the range of 3,000 to 5,000 rpm as the rinsing is completed and while the wafer is being subsequently dried as hereinafter more fully described.

A sealing device 26 receives the drive shaft 23 so as to very tightly seal the exterior of the drive shaft so as to completely isolate the etch chamber 12 and the opening 22 through which the shaft extends, from the ambient at the exterior of the processing apparatus 10.

The drive shaft 23 is hollow to provide a duct or passageway 27 which communicates with the duct or passageway 28 extending through the vacuum chuck 13. The lower or outer end of drive shaft 23 is connected through a rotary union 29 to a supply tube or duct 30. The tube 30 is connected through a valve 31 to alternate sources of vacuum and nitrogen which are connected to the valve by tubes or ducts 32 and 33, respectively. Accordingly, nitrogen may be supplied into the passageway 28 through the wafer support 13; or alternately a vacuum may be drawn on the passageway 28.

The wafer support 13 has a flat round disc 34 on which the wafer W lies during processing of the wafer. The wafer support 13 incorporates a unidirectional check valve 35 so as to close the upper end of passageway 28 when nitrogen gas is supplied under pressure into the passageway 28, at which time the valve element or ball 36 is raised by the flow of nitrogen gas upwardly against a valve seat formed by an O-ring 37 in the passage. Normally, the flow passage 38 through the check valve is open and unobstructed because the valve element 36 is away from the valve seat 37, and the valve element rests upon support surfaces 39 adjacent bypass grooves 40 which allow a vacuum to be drawn through the passages 38 on the wafer W when the vacuum is applied in the passageway 28, thereby holding the wafer stationary on the support 13.

Normally, while etchant gases, including gaseous hydrogen fluoride, water vapor and a diluent such as nitrogen, are in the etch chamber 12, nitrogen will be flowed upwardly through the shaft 27 and passageway 28 and through the check valve 35 at a slow rate of speed so that there is no possibility of the etchant gas flowing downwardly through the passageway 28 and into the source of vacuum. Later during rinsing and high-speed spinning of the wafer, the vacuum is drawn in the passageway 28 and 38 to tightly secure the wafer on the support or wafer chuck 13 to prevent any damage to the wafer during the high-speed rotating.

The opening 22 in the base 20 is supplied with an inert gas such as nitrogen through passages 41 which are connected to a source of nitrogen supplied by the tube 42.

As a part of the head means 11, the housing 17 includes a sidewall 43 which is defined in several segments or portions 44, 45 and 46.

The upper portion 44 of the sidewall is formed integrally with the top wall 47 of the housing and cooperates with the top surface 48 of the base 20 in defining the etching chamber 12 when the housing is entirely closed as illustrated in FIG. 1. The sidewall 44 provides a port 49 through which the etchant gas is supplied into the etch chamber 12. The port 49 is connected by a fitting 50 and supply tube 51 to valving and flow controllers 52, 53 and 54 which are connected with sources of anhydrous hydrogen fluoride gas or other anhydrous hydrogen halide gas, a source of nitrogen or other inert gas, and a source of water vapor which provides the necessary components for the etchant gas for etching the oxides of the wafer W.

The top wall 47 is affixed as by mechanical fasteners to a mounting plate 55 which is fastened to the vertically extendable and rectractable piston rod 56 of a pneumatic cylinder 57 which is secured to the frame 19. The pneumatic cylinder is suitably connected to sources of air under pressure with the capability of raising and lowering the upper portion of the housing 17, including the sidwall 44 and top wall 47.

The sidewall 44 also mounts a diffuser panel 58 which entirely traverses the etch chamber 12 and confronts the wafer W below the level of port 49 for passing the etchant gas therethrough and evenly distributing the gas over the entire surface area of the wafer W. The diffuser 58 may in one form be a plastic membrane with pores in the range of 20 to 50 microns in size, uniformly dispersed across the membrane for passing the etchant gas therethrough. The membrane may be formed of various materials such as polyethylene, or in some cases, polyvinylidene difluoride, also known as PVDF. Alternately, the membrane may be made of polytetrafluoroethylene, also known PTFE and by its trademark Teflon, owned by DuPont. Of course, other forms of diffusers may be used to uniformly spread the etchant gas across the face of the wafer W.

The wall portion 44 has a groove 59 formed therein, beneath the level of the diffuser 58 and extending around the entire periphery of wall 44. The groove 59 serves as a manifold to collect all of the spent etchant gases and discharge the spent etchant gases through a port 60 which is connected to a fitting 61 and discharge tube 62 through which the etchant gases are flowed after they have been passed over the face of the wafer W. The entire periphery of groove 59 is covered by a membrane 63, of material similar to that in the diffuser 58 so that the spent etchant gases will flow outwardly to all peripheral portions of the groove 59, thereby contributing to the uniformity of flow of the etchant gases over the face of the wafer W.

The lower face 64 of the wall portion 44 confronts and seals against the top face 65 of the intermediate wall portion 45 which is also referred to as a deflector ring. The wall portions 44 and 45 are separable, as hereinafter more fully explained, to provide an access port for inserting and subsequently replacing the wafer W prior to and after the end of the etch-rinse processing accomplished by the apparatus 10. In FIG. 1, the upwardly shifted position of the side and top wall portions 44, 47 and of the mounting plate 55 is illustrated in dotted lines; and the upwardly shifted position of the bottom face 64 of the wall portion 44 is illustrated by the dotted line 64'. The space between the dotted line 64' and the face 65 of the deflector ring 45 defines the access opening through which wafers may be inserted and replaced.

The deflector ring 45 has an inner peripheral cylindrical surface 66 which is aligned with and is slidable onto the outer cylindrical surface 21 of the base 20. A peripheral ledge 67 or deflector 45, adjacent the inner periphery of deflector ring 45 normally confronts the rib 68 which is rigid with the base 20 and is sealed thereto by an O-ring seal to prevent the passage of any fluids, either in gaseous or liquid form, when the housing is entirely closed as illustrated in FIG. 1.

Deflector ring 45 also has a downwardly facing and peripheral oblique conical surface 69 which normally cooperates with the lower portion 46 of the sidewall 43 to define the means for collecting spent rinsing liquid indicated in general at numeral 16 and more specifically, in defining the peripheral passage 70 which collects the spent rinsing water as hereinafter more fully described.

The deflector ring 45 also has a rinsing water supply port 71 therethrough and oriented to direct a stream of rinsing liquid or deionized water onto the face of wafer W at the end of the etch cycle. The rinse water port 71 is connected by a tube 72 and a valve 73 to a source of deionized water at tube 74. Valve 73 alternately connects the port 71 and tube 72 to a source of vacuum provided by the duct 75 so as to evacuate the port 71 and tube 72 and remove all of the moisture therefrom at the end of a rinsing and drying cycle and prior to the beginning of another etch cycle.

Wall portion 46, which may be otherwise known as a collecting cup, is affixed at its upper edge portion 76 to the deflector ring 45; and the cup 46 also defines a peripheral groove 77 around its entire circumference as a portion of the collecting passage 70 for receiving rinsing water spilled off the periphery of the wafer W and deflected from the deflector surface 69. A drain port 78 is provided in the cup 46 and is connected by a fitting to a drain tube 79 which extends downwardly from the cup 46 and through a notch 80 formed in the baseplate 18.

A pair of pneumatic cylinders 81 and 82 are mounted on the baseplate 18 and have their piston rods 83 extending through suitable access ports in the baseplate 18 and affixed to the cup 46 by fittings 84. The cup 46 also has a cylindrical inner peripheral surface 85 to receive and slide along the outer cylindrical surface 21 of the base 20. The cylinders 81 and 82 are suitably connected to sources of air for extending and retracting the piston rods, to raise and lower the cup ring 46.

The processing apparatus is also to be used with suitable robotic water handling devices for inserting and removing the wafer W into and from the chamber 12. A positioning arm or fork 86 operated by a rodless cylinder 87 is also attached to the baseplate 18 and arranged to accurately position the wafer W on the wafer support or chuck 24 in order to accommodate high-speed spinning of the wafer without any likelihood of damaging the wafer.

OPERATION

Assuming that a wafer W has been placed on the support or wafer chuck 24, the processing apparatus is operated substantially as follows. The housing 17 is in closed condition, substantially as illustrated in FIG. 1, wherein the edge of the wafer is opposite the groove 59, and the inner periphery of the deflector ring 45 is sealed against the rim 68 of the base, and the faces 64 and 65 of the wall portion 44 and the deflector ring 45 are sealed against each other. The chamber will be purged of all air as the cycle is started by flowing nitrogen into the chamber which also flows through the membrane or diffuser 58, across the diaphragm and out through the groove 59 and discharge port 60. At this time, nitrogen is also flowing inwardly through the ports 41 and the opening 22 in base 20 so that nitrogen flows around the lower side of the wafer, thereby purging all of the air from the chamber. The rinsing port or duct 71 is empty and closed and the entire interior of the head is completey dry.

When purging is complete a presribed etchant gas, preferably comprising a portion of anhydrous hydrogen fluoride gas, a diluent inert gas preferably nitrogen, and a small portion of water vapor is flowed into the etch chamber for a prescribed length of time, depending upon the amount of etching of the oxide film on the wafer which is to be accomplished. During the etching process, the wafer chuck 24 is revolved by the motor at a slow speed, in the range of 20 rpm, and no vacuum is applied for purpose of holding the wafer on the wafer chuck; but on the other hand, during the etching process, nitrogen is supplied through the passage 27 in the shaft 23, and through the opening 28 in the wafer chuck so that a rather small flow of nitrogen continues all during the etching so as to specifically prevent the migration of any of the etchant gas downwardly through the shaft 28 which might otherwise occur had the nitrogen not been flowing. During the etching phase of the cycle, nitrogen continues to flow from the ports 41 through the central opening 22 of the base and around the bottom face of the wafer, thereby preventing or minimizing any etching of the bottom face of the wafer. As the etchant gas is diffused by the diffuser 58, it passes through the membrane 58 and is uniformly applied across the entire face of the wafer W. As the etchant gas flows across the face of the wafer, it will pass outwardly through the membrane 63 and into the peripheral groove 59 and be discharged outwardly through the port 60 and tube 62.

When the necessary time has elapsed during the etching phase of the cycle, the flow of the etchant gas is terminated, and the flow of nitrogen from the source controller 53 will continue to flow, and the continued flow of nitrogen, but without the hydrogen fluoride gas, will purge the etch chamber of the etchant gas.

Figure 2:
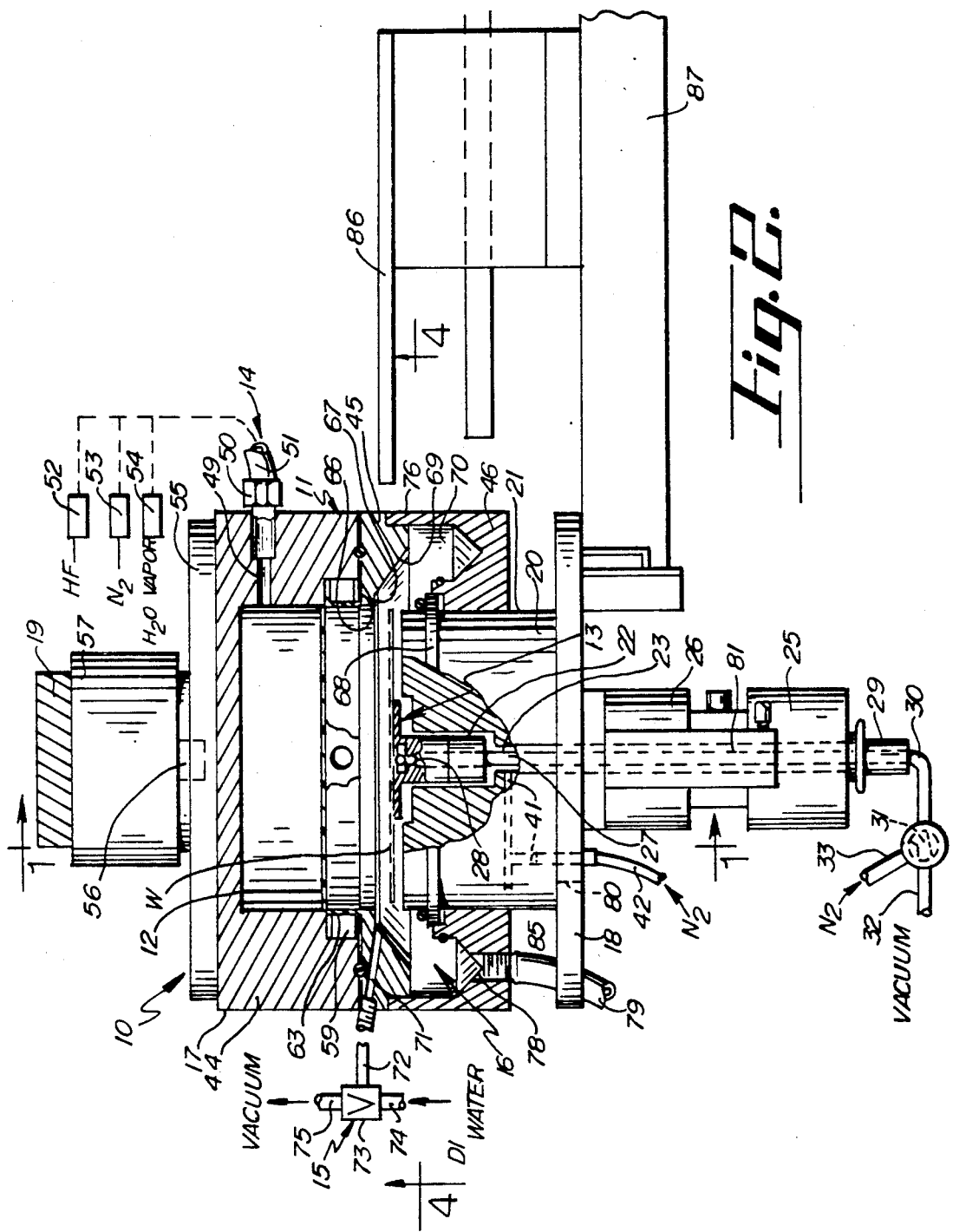
FIG. 2 is a section view through the processing apparatus taken approximately at 2—2 of FIG. 1 and having portions broken away for clarity of detail.
Figure 3:
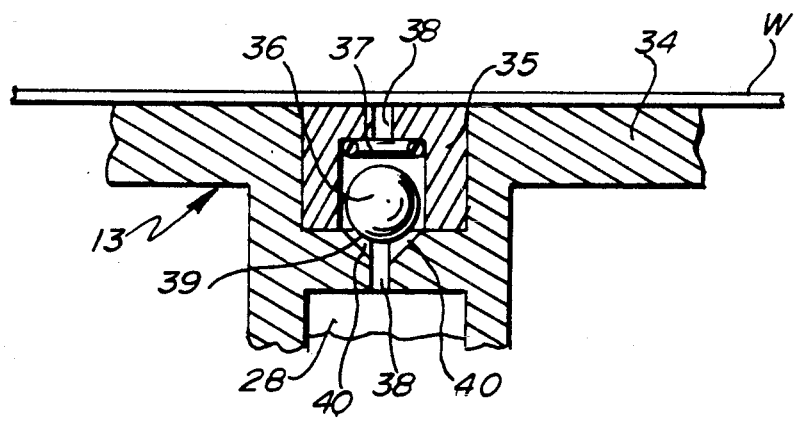
FIG. 3 is an enlarged detailed section view taken approximately at 3—3 in FIG. 1.
Figure 4:
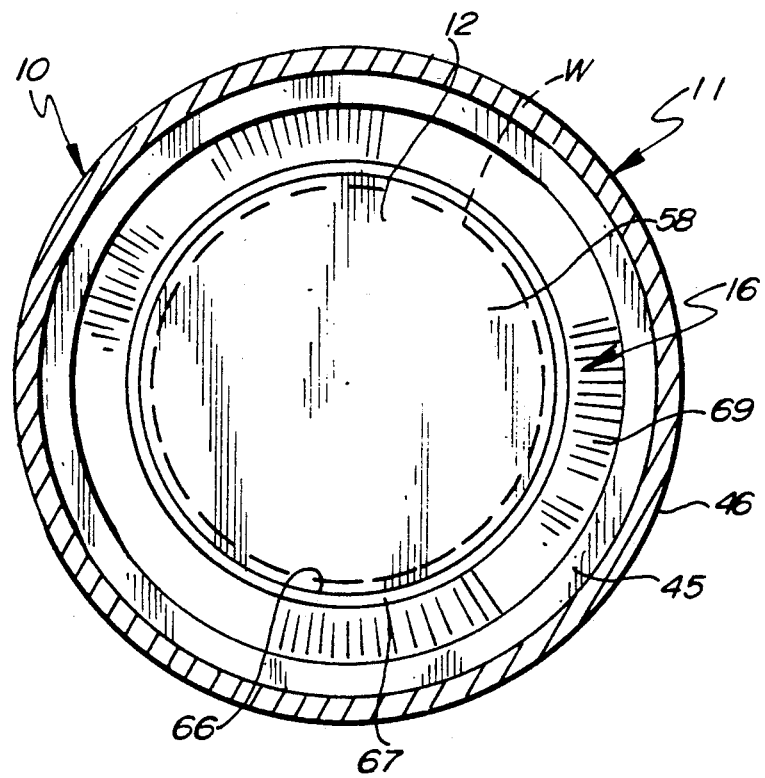
FIG. 4 is a detailed section view taken along a broken line as indicated substantially at 4—4 in FIG. 2.

When purging of the chamber 12 has been completed after the etching phase of the cycle, the pneumatic cylinders 81 and 82 are operated to raise the entire housing from the position illustrated in FIG. 1 to the position illustrated in FIG. 2. In this position of the housing, the wafer chuck 24 and the edge of the wafer W is directly opposite the entrance to the port 70 and directly opposite the deflection surface 69. The drain tube 79 is open and unobstructed to allow drainage of any collected rinsing liquid which is to be applied during a rinsing phase of the cycle. In preparation for rinsing, the valve 31 is operated to apply vacuum pressure to the wafer chuck 24 as to hold the wafer securely on the wafer chuck; and when the vacuum has been applied, the motor accelerates the wafer to rotate the wafer in the range of 500 to 1,500 rpm. At this time, rinsing liquid, preferably deionized water, is supplied from the source 74 through the valve 73 and port 71 into the chamber 12, and the deionized water is directed onto the upper face of the wafer to be flowed entirely across the upper face of the wafer. The high speed of rotation of the wafer causes the rinsing liquid to be slung by centrifugal force outwardly into the passage 70 and onto the deflector face 69 so that the rinsing liquid is collected at the bottom of the passage and will be immediately drained off through the drain port 78 and tube 79.

After completion of the rinse step in the cycle, flow of the rinsing water through duct 71 is terminated, and the valve 73 is operated to draw a vacuum onto the duct 71, thereby sucking out all of the moisture that may remain in the line. At this same time, the nitrogen from the source and controller 53 is continued so as to supply drying nitrogen into the chamber 12 and cause flow of the drying nitrogen through the chamber and out through the passage 70. During this flow of the nitrogen and after the completion of the rinsing phase of the cycle, the motor 25 is again accelerated to rotate the wafer W at speeds in the range of 3,000 to 4,000 rpm. During this drying phase of the cycle, the cylinders 81 and 82 continue to hold the sidewalls of the housing in the upwardly shifted position as illustrated in FIG. 2; and of course nitrogen continues to flow through the ducts 41 and through the opening 22 in the base 20 so that drying nitrogen will flow through all portions of the chamber.

Subsequent to the drying, it may be desirable to repeat the etching phase of the cycle to remove small portions of native oxide that may have regrown on the face of the wafer. Accordingly, the cyliners 81 and 82, in preparation for renewing the etching phase of the cycle, will withdraw their piston rods to lower the sidewalls and upper portion of the housing into the position of FIG. 1 again wherein the ledge 67 of the deflector ring is sealed against the external rib 68 of the base, and then the entire etch chamber will again be sealed. The chamber will be purged with continued flow of nitrogen from the controller 53 and the etching phase of the cycle will be repeated as hereinbefore described. Of course, after the etching phase is completed, the rinsing phase is again repeated as previously described.

After the end of the rinsing phase and drying phase of the cycle, it may be determined that processing of the wafer is completed, so that the wafer should be removed from the processing apparatus. The pneumatic cylinder 57 is then operated so as to hold the wall portion 44 and the upper wall 47 in the position illustrated in the FIG. 2. The deflector ring 45 and cup ring 46, being at that time in the upwardly shifted position illustrated in FIG. 2, will be lowered by operation of the cylinders 81 and 82 so that the rings 45 and 46 assume the position illustrated in FIG. 1. The upper portion of the housing remains in the upwardly shifted position illustrated by the dotted lines in FIG. 1 so that the confronting faces 64 and 65 of the wall portions 44 and deflector ring 45 are thereby separated to open an access port therebetween through which access to the wafer can be had for removal of the wafer and replacing of the wafer with another.

Finally, when the wafer has been replaced and its position adjusted by the arm or fork 86, the air cylinder 57 is again operated to lower the wall portion 44 onto the deflector ring 45, as to close the etch chamber again in preparation for the etching phase of another cycle.

The present invention may be embodied in other specific forms without departing from the spirit or essential attributes thereof. Therefore, the illustrated embodiments should be considered in all respects as illustrative and not restrictive, reference being made to the appended claims rather than to the foregoing description to indicate the scope of the invention.

We claim:

1. Apparatus for etching and rinsing a single semiconductor wafer, comprising
   head means defining an etching chamber capable of being opened and closed to permit a wafer to be loaded into and removed from the chamber,
   support means mounting a wafer in the chamber, said support means being capable of rotating the wafer,
   means flowing and interrupting flow of etchant gas and other gas through the chamber and across at least a portion of the wafer,
   a source of rinsing liquid comprising a duct into the etching chamber to direct the rinsing liquid onto and across the wafer,
   and means collecting the rinsing liquid from the chamber.

2. Apparatus according the claim 1 wherein the head means comprises
   base means and wall means defining the etching chamber, the wall means having a peripheral rinsing liquid receiving passage opposite the support means for collecting the rinsing liquid slung from the rotating wafer.

3. Apparatus according o claim 1 wherein the head means comprises a peripheral wall with open passage means opposite the support means and extending around at least a portion of the wall to receive rinsing liquid slung from the rotating wafer, and means restricting flow of gases from the chamber and through the passage.

4. Apparatus according to claim 1 wherein the head means comprises a peripheral wall with open passage means opposite the support means and extending around at least a portion of the wall to receive rinsing liquid slung from the rotating wafer, and means closing said passage with respect to the etching chamber.

5. Apparatus according to claim 1 wherein the head means comprises a peripheral wall with open passage means around at least a portion of the wall adjacent the support means to receive rinsing liquid slung from the rotating wafer, the support means and peripheral wall being relatively movable with respect to each other whereby the wafer may be alternately located opposite the open passage and away from the passage.

6. Apparatus according to claim 2 wherein the base means and wall means are relatively movable with respect to each other whereby the base means alternately closes and opens flow communication between the chamber and the passage.

7. Apparatus according to claim 2 wherein said wall means further comprises a peripheral deflector surface obliquely oriented adjacent the support means and wafer to deflect rinsing liquid away from the wafer.

8. Apparatus according to claim 5 and the peripheral wall comprises upper and lower portions separable from each other to define an access port into the chamber for accessing the wafer.

9. Apparatus according to claim 8 and the support means and peripheral wall being relatively movable to position the wafer at various locations along the wall whereby the wafer may be alternately located opposite the open passage and opposite the access port.

10. Apparatus for etching and rinsing a semiconductor wafer comprising
    a housing comprising a closed etching chamber and a peripheral sidewall enclosing the chamber,
    rotatable support means in the etching chamber suitable for mounting and rotating such a wafer,
    means flowing and interrupting flow of etchant gas and other gas through the chamber and across at least a portion of the wafer,
    means directing rinsing liquid into the etching chamber and onto and across the wafer on the support means, and
    the peripheral sidewall comprising open passage means around at least a portion of the sidewall and opposite the rotatable support means and wafer to receive rinsing liquid slung from the rotating wafer.

11. Apparatus according to claim 10 wherein the housing also comprises a base portion relatively slidable along the peripheral sidewall to open and close the open passage means.

12. Apparatus according to claim 10 wherein the peripheral sidewall also comprises a deflector surface portion in said open passage means, the deflector surface portion being oriented obliquely to the peripheral sidewall to obliquely deflect liquid particles slung from the rotating wafer.

13. Apparatus according to claim 11 wherein said rotatable support means is on the base portion, the wafer and support means having an alternate position relative to the peripheral sidewall when relative movement between the base and sidewall closes the passage means, and the peripheral sidewall also comprising a gas outlet manifold portion extending around at least a portion of the sidewall and located opposite said alternate position of the support means to receive the gases after the gases have flowed across the portions of the wafer.

14. Apparatus according to claim 13 wherein the housing sidewall comprises an upper portion separable from adjacent portions of the sidewall at a joint adjacent the manifold portion, the sidewall defining an access opening at said joint when the upper portion is separated from the adjacent portions of the sidewall to facilitate moving a wafer into and out of the etching chamber.

* * * * *

UNITED STATES PATENT AND TRADEMARK OFFICE
CERTIFICATE OF CORRECTION

PATENT NO. : 5,169,408

DATED : December 8, 1992

INVENTOR(S) : Rex L. Biggerstaff, Charles W. Skinner, Daniel Syverson, Mark L. Jenson, James G. Kegley It is certified that error appears in the above-identified patent and that said Letters Patent is hereby corrected as shown below:

Column 4, line 44 delete "or deflector 45" and insert therfor --on deflector ring 45--.

Signed and Sealed this

Twenty-third Day of November, 1993

Attest:

BRUCE LEHMAN

Attesting Officer

Commissioner of Patents and Trademarks